(12) United States Patent
Miller (10) Patent No.: US 8,526,093 B2
(45) Date of Patent: Sep. 3, 2013

(54) ELECTRICALLY PROGRAMMABLE RETICLE AND SYSTEM

(75) Inventor: Keith Randolph Miller, Wappingers Falls, NY (US)

(73) Assignee: Advanced Micro Devices, Sunnyvale, CA (US)

( * ) Notice: Subject to any disclaimer, the term of this patent is extended or adjusted under 35 U.S.C. 154(b) by 494 days.

(21) Appl. No.: 12/785,627

(22) Filed: May 24, 2010

(65) Prior Publication Data

US 2011/0299148 A1    Dec. 8, 2011

Related U.S. Application Data (63) Continuation of application No. 11/696,862, filed on Apr. 5, 2007, now Pat. No. 7,724,416.

(51) Int. Cl.
*G02F 1/15* (2006.01)
*G02F 1/153* (2006.01)

(52) U.S. Cl.
USPC ........... 359/265; 359/270; 359/275; 359/318; 463/29; 463/31

(58) Field of Classification Search
USPC ............. 359/265–275, 241, 318; 463/16, 463/17, 20, 29, 31–33, 42; 345/105, 173, 345/174
See application file for complete search history.

(56) References Cited

U.S. PATENT DOCUMENTS

| | | | |
|---|---|---|---|
| 3,230,379 A | | 1/1966 | Aroyan |
| 3,336,480 A | | 8/1967 | Raabe |
| 4,309,091 A | * | 1/1982 | Fukuhara et al. .............. 396/234 |
| 4,416,517 A | * | 11/1983 | Beall et al. ..................... 359/270 |
| 4,498,156 A | | 2/1985 | Pizzarello |
| 4,775,227 A | * | 10/1988 | Silver ............................ 359/273 |
| 5,111,328 A | * | 5/1992 | Demiryont ..................... 359/265 |
| 5,298,351 A | | 3/1994 | Bobroff |
| 5,384,653 A | | 1/1995 | Benson |
| 5,691,541 A | | 11/1997 | Ceglio |
| 6,577,355 B1 | | 6/2003 | Yaniv |
| 6,784,446 B1 | | 8/2004 | Phan |
| 7,072,502 B2 | | 7/2006 | Hemar |
| 7,113,165 B2 | | 9/2006 | Vincent |
| 7,309,284 B2 | * | 12/2007 | Griswold et al. ............... 463/29 |
| 7,609,339 B2 | | 10/2009 | Choi |
| 7,973,997 B2 | * | 7/2011 | Lee ............................... 359/275 |
| 8,118,670 B2 | * | 2/2012 | Griswold et al. ............... 463/29 |
| 8,192,281 B2 | * | 6/2012 | Williams et al. ................ 463/31 |
| 2004/0090399 A1 | | 5/2004 | Bal-Yona |
| 2007/0103612 A1 | | 5/2007 | Lumpkin |

\* cited by examiner

*Primary Examiner* — Loha Ben
(74) *Attorney, Agent, or Firm* — Meyertons Hood Kivlin Kowert & Goetzel (57) ABSTRACT

An electrically programmable reticle is made using at least one electrochromatic layer that changes its optical transmissibility in response to applied voltages. Transparent conductor layers are configured to the desired patterns. The electrically programmable reticles are either patterned in continuous forms that have separately applied voltages or in a matrix of rows and columns that are addressed by row and column selects such that desired patterns are formed with the application of a first voltage level and reset with the application of a second voltage level.

22 Claims, 5 Drawing Sheets

ELECTRICALLY PROGRAMMABLE RETICLE AND SYSTEM

This application is a continuation of U.S. patent application Ser. No. 11/696,862, entitled "Electrically Programmable Reticle and System", filed Apr. 5, 2007.

TECHNICAL FIELD

The present invention relates to reticles used in integrated circuit manufacture and in particular to reticles that have characteristics that may be electrically modified.

BACKGROUND INFORMATION

In semiconductor device fabrication, the various processing steps fall into four general categories: deposition, removal, patterning, and modification of electrical properties. Deposition is any process that grows, coats, or otherwise transfers a material onto the wafer. Available technologies consist of physical vapor deposition (PVD), chemical vapor deposition (CVD), electrochemical deposition (ECD), molecular beam epitaxy (MBE) and more recently, atomic layer deposition (ALD) among others. Removal processes are any that remove material from the wafer either in bulk or selective form and consist primarily of etch processes, both wet etching and dry etching such as reactive ion etch (RIE). Chemical-mechanical planarization (CMP) is also a removal process used between levels. Patterning covers the series of processes that shape or alter the existing shape of the deposited materials and is generally referred to as lithography. For example, in conventional lithography, the wafer is coated with a chemical called a "photoresist." The photoresist is exposed by a "stepper," a machine that focuses, aligns, and moves the mask, exposing select portions of the wafer to short wavelength light. The unexposed regions are washed away by a developer solution. After etching or other processing, the remaining photoresist may be removed by plasma ashing.

Semiconductor manufacturing entails the formation of various patterns on wafers. These patterns define the structure of and interconnection between the different components and features of the integrated circuit. The patterns are formed on wafers using patterning tools known as masks and reticles.

A mask is defined as a tool that contains patterns which can be transferred to an entire wafer or another mask in just a single exposure. A reticle is defined as a tool that contains a pattern image that needs to be stepped and repeated in order to expose the entire wafer or mask. Reticles have two major applications: 1) printing of images directly onto wafers in equipment known as step-and-repeat aligners; and 2) printing of images onto masks which, in turn, transfer the images onto wafers. The patterns on a reticle are usually 2× to 20× the size of the patterns on the substrate. However, some reticle patterns are 1× the substrate pattern.

The equipment used for printing patterns on substrates that are smaller than the patterns on the reticles is also referred to as a 'reduction stepper', while one that's used for printing equal-size patterns is known as a lx stepper. The 'polarity' of a mask or reticle can either be positive or negative. A positive mask or reticle has background areas (or fields) that are clear or transparent, which is why a positive mask or reticle is also known a 'clear-field' tool. A negative mask or reticle has fields that are opaque, which is why a negative mask or reticle is also known as a 'dark-field' tool.

There are many ways by which a pattern may be transferred to a wafer using a mask, a reticle, or a combination of both. Regardless of the pattern transfer process, everything starts with a set of pattern data that are converted into an actual pattern by a 'pattern generator.' Commonly-used pattern generators include: 1) plotters; 2) optical pattern generators; and 3) electron beam pattern generators.

The patterns generated by the pattern generators are formed on either a mask or reticle. For example, plotter-generated patterns can be photo-reduced and formed on 10× emulsion reticle, while optically generated patterns can be formed on 5-20× hard-surface reticles. E-beam generated patterns can be formed on a 5-10× reticle, a 1× reticle, a 1× hard surface mask, or even directly to the wafer.

The patterns formed on a reticle can be transferred directly onto the wafer, or they may first go to a mask which is the one that transfers the patterns to the wafer. Patterns on masks generally get transferred to the wafer directly.

Currently reticles are patterned with fixed images which will block light in certain regions while allowing light to penetrate other regions. This allows an image of the design to be translated to the silicon through a lithographic system. Reticles are the source image for generating patterns in semiconductor processing. They suffer from high cost and slow turn-around times required when first fabricated or modified. In addition, each reticle is a fixed design which means that any changes in a design require a new reticle to be fabricated.

Therefore, there is a need for a multi-use reticle that may be programmed using electrical signals. This would allow for more flexible designs, a more rapid turn-around time from concept to test and an overall reduction in system costs.

SUMMARY OF THE INVENTION

An electrically programmable reticle is fabricated as a sandwich of materials including an electrochromatic layer whose optical transmissivity is voltage controlled. In one embodiment, the electrochromatic layer has adjacent layers that enhance the transference of positive and negative ions into the electrochromatic layer in response to selectively applied voltages wherein the ions are operable to change the optical characteristics until another voltage is applied to reverse the process. Transparent conductor layers are applied to both sides of the sandwich layer and patterned so that the voltages may be selectively applied to particular areas of over the electrochromatic layer.

In one embodiment, at least one of the transparent conductor layers is patterned to create continuous "islands" in desired shapes. These "islands" are coupled to voltage source (s) with electrically controlled switches such that the voltage may be applied to the islands to configure the reticle in desired transparent and opaque patterns.

In another embodiment, the transparent conductors are patterned into rows and columns such that a matrix patterned may be programmed by selectively applying voltages to one row and then applying voltages to each column that has a pixel that is to be programmed to a particular optical state by the application of a voltage level.

The foregoing has outlined rather broadly the features and technical advantages of the present invention in order that the detailed description of the invention that follows may be better understood. Additional features and advantages of the invention will be described below.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The particulars shown herein are by way of example and for purposes of illustrative discussion of the preferred embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings making apparent to those skilled in the art how the several forms of the invention may be embodied in practice.

The following definitions and explanations are meant and intended to be controlling in any future construction unless clearly and unambiguously modified in the following examples or when application of the meaning renders any construction meaningless or essentially meaningless. In cases where the construction of the term would render it meaningless or essentially meaningless, the definition should be taken from Webster's Dictionary, $3^{rd}$ Edition.

As used herein, the term "attached," or any conjugation thereof describes and refers to the at least partial connection of two items.

As used herein, the term "dielectric" means and refers to a substance in which an electric field may be maintained with zero or near-zero power dissipation, i.e., the electrical conductivity is zero or near zero. In various embodiments, a dielectric material is an electrical insulator.

As used herein, a "fluid" is a continuous, amorphous substance whose molecules move freely past one another and that has the tendency to assume the shape of its container, for example, a liquid or a gas.

As used herein, the term "integral" means and refers to a non jointed body.

As used herein, the term "optical anisotropy" means and refers to a property of being optically directionally dependent. Stated another way, it is the behavior of a medium, or of a single molecule, whose effect on electromagnetic radiation depends on the direction of propagation of the radiation.

As used herein, the term "reaction chamber" means and refers to a gas activation zone. The reaction chamber is capable of being defined by walls or other boundaries, but also is capable of comprising a zone or other unrestricted area.

As used herein, the term "semiconductor device" means and refers to at least one device used in or with a formation of transistors, capacitors, interconnections, batteries, supercapacitors, and/or the like, particularly various memory devices, such as, but not limited to DRAM, SRAM, SCRAM, EDRAM, VDRAM, NVSRAM, NVDRAM, DPSRAM, PSDRAM, transistor/capacitor cell devices, vias or interconnects, and vertical stacks of logic gates. However, other devices utilizing transistors at least one transistors, capacitors, interconnections, and/or the like are to be included within this definition.

As used herein, the term "trace" is not intended to be limiting to any particular geometry or fabrication technique and instead is intended to broadly cover an electrically conductive path.

Other than in the operating examples, or where otherwise indicated, all numbers expressing quantities of ingredients or reaction conditions used herein are to be understood as modified in all instances by the term "about".

References herein to terms such as "vertical" and "horizontal" are made by way of example to establish a frame of reference. The term "horizontal" as used herein is defined as a plane parallel to the conventional plane or surface of substrate. The term "vertical" refers to a direction perpendicular to the horizontal, as defined above. Terms, such as "on", "above", "below", "side" (as in "sidewall"), "higher", "lower", "over", "beneath" and "under", are defined with respect to the horizontal plane.

In chemistry, chromism is a process that induces a reversible change in the colors of compounds. In most cases, chromism is based on a change in the electron states of molecules, especially the π- or d-electron state, so this phenomenon is induced by various external stimuli which can alter the electron density of substances. It is known that there are many natural compounds that have chromism, and many artificial compounds with specific chromism have been synthesized to date.

Chromism is classified by what kind of stimuli are used. The major kinds of chromism are as follows:

Thermochromism, the most common chromism of all, is chromism that is induced by heat, that is, a change of temperature;

Photochromism, a phenomenon based on the isomerization between two different molecular structures, is induced by light irradiation;

Solvatochromism depends on the polarity of the solvent, where solvatochromic compounds are metal complexes; and Electrochromism is induced by the gain and loss of electrons. This phenomenon occurs in compounds with redox active sites, such as metal ions or organic radicals. The present invention uses the process of electrochromism to formulate new and novel reticles for IC manufacture.

Electrochromic materials darken when voltage is added and are transparent when voltage is taken away. Electrochromic materials may be used to produce a window, mask or reticle that may be adjusted to allow varying levels of visibility rather than an all-or-nothing window formed using liquid crystal materials.

"Electrochromic" describes materials that can change color when energized by an electrical current. Essentially, electricity kicks off a chemical reaction in this sort of material. This reaction (like any chemical reaction) changes the properties of the material. In this case, the reaction changes the way the material reflects and absorbs light. In some electrochromic materials, the change is between different colors. In electrochromic windows, the material changes between colored (reflecting light of some color) and transparent (not reflecting any light).

At its most basic level, an electrochromic window needs this sort of electrochromic material and an electrode system to change its chemical state from colored to transparent and back again. There are several different ways to do this, employing different materials and electrode systems.

Like other smart windows, electrochromic windows are made by sandwiching certain materials between two panes of glass. Here are the materials inside one basic electrochromic window system and the order in which they are layered:

Glass or plastic panel;
Conducting oxide;
Electrochromic layer, such as tungsten oxide;
Ion conductor/electrolyte;
Ion storage;
A second layer of conducting oxide; and
A second glass or plastic panel.

In this design, the chemical reaction at work is an oxidation reaction; a reaction in which molecules in a compound lose an electron. Ions in the sandwiched electrochromic layer are what allow it to change from opaque to transparent. It's these ions that allow it to absorb light. A power source is wired to the two conducting oxide layers, and a voltage drives the ions from the ion storage layer, through the ion conducting layer and into the electrochromic layer. This makes the glass opaque. By shutting off the voltage, the ions are driven out of the electrochromic layers and into the ion storage layer. When the ions leave the electrochromic layer, the window regains its transparency.

With an electrochromic smart-window, it only requires electricity to make the initial change in opacity. Maintaining a particular shade does not require constant voltage. One merely needs to apply enough voltage to make the change, and then enough to reverse the change making this process energy efficient.

New reflective hydrides that are being developed behave in a noticeably different way. Instead of absorbing light, they reflect it. Thin films made of nickel-magnesium alloy are able to switch back and forth from a transparent to a reflective state. The switch can be powered by low-voltage electricity (electrochromic technology) or by the injection of hydrogen and oxygen gases (gas-chromic technology). Furthermore, this material has the potential to be even more energy efficient than other electrochromic materials.

Various embodiments of the present invention design reticles where the typical Chrome layer is replaced by an electrochromatic film that is transparent with the application of a voltage X and opaque or reflective at an application of a voltage Y. The electrochromatic film is patterned on a reticle substrate with wiring layers as necessary to allow the application of separate voltages to the electrochromatic patterns. This allows for flexibility in design as well as enabling multi-use capabilities.

In one embodiment, a fixed pattern may implemented that produces a standard reticle pattern when the voltage X is applied while producing the complement of the reticle patter when the voltage Y is applied. A reticle pattern and its complement are commonly needed in IC processes such as implantation. Presently, in various embodiments, this requires two separate reticle designs, however, the present invention would reduce this to a single reticle that is customized by applied voltages.

In another embodiment, a reticle is produced with a matrix of minimum geometry elements similar to a computer display. In this manner, these elements or pixels may be independently controlled allowing for a wide range of design implementations. The matrix design would be particularly useful in development activities where testing new designs could be achieved simply changing the voltage applied to individual elements as opposed to having to wait for the fabrication of new reticles, which is common in the present state of the art. Additional uses for the electrochromatic reticle of the present invention would be the use in generating dummy tiles for better processing control, fixed elements for existing reticles, and as programmable elements in existing reticle designs.

Implementing such a reticle system according to embodiments of the present invention may be accomplished by creating a reticle that may be programmed by an off-line system or by hardwiring a reticle with a lithographic system which could allow for real-time changes in a reticle while the lithographic system is in use.

Figure 1A:
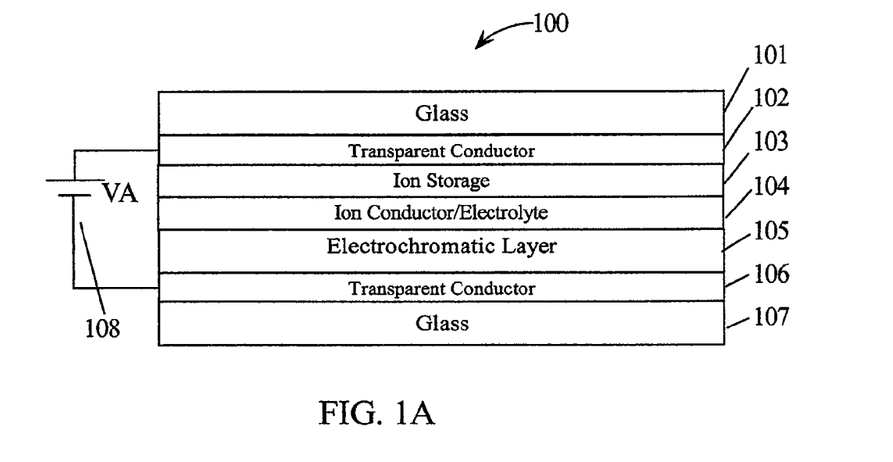
FIG. 1A is a cross section of layers of material including an electrochromatic layer suitable for fabricating a reticle according to embodiments of the present invention.

FIG. 1A is a cross-section view of a composite material 100 suitable for practicing embodiments of the present invention. One way of fabricating composite material 100 would start with glass layer 107. Transparent conductor layer 106 would be deposited over glass layer 107 and would then be patterned as determined by a pre-determined desired reticle design. An electrochromatic layer 105 is then deposited over transparent conductor layer 106. Layers of ion conductor/electrolyte 104 and ion storage 103 are deposited over electrochromatic layer 104. A second transparent conductor layer 102 is deposited and patterned to be synergistic with transparent conductor layer 106. Finally, a second protective glass layer 101 completes composite material 100. Voltage 108 is selectively coupled to sub-patterns of transparent conductors 102 and 106. When voltage 108 is shown having a first value VA, the portion of the electrochromatic layer 105 overlaid by conductor patterns is transparent.

Figure 1B:
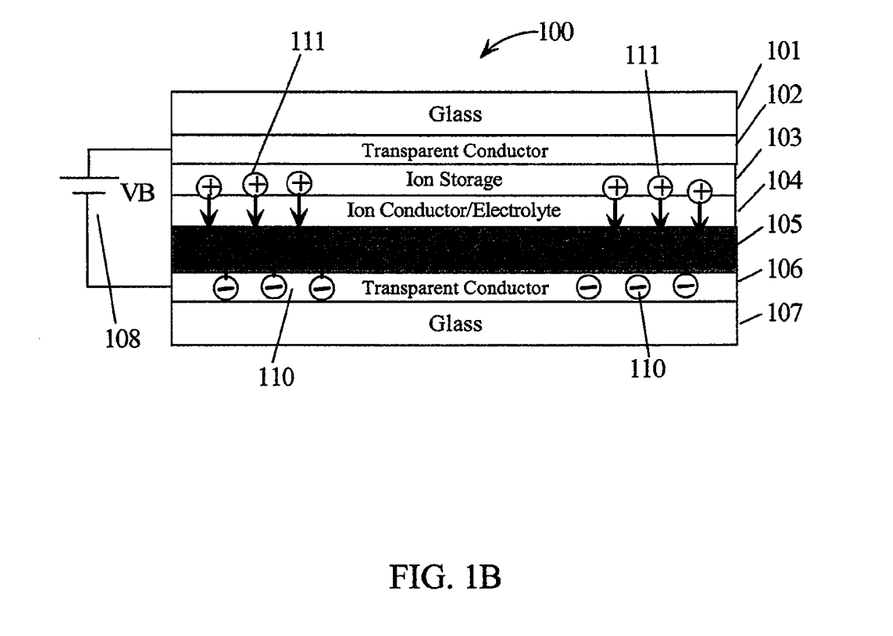
FIG. 1B is the cross section of FIG. 1A with a voltage applied across the electrochromatic layer.

FIG. 1B is a cross-section view of composite material 100 wherein voltage 108 has second value VB that causes the electrochromatic layer 105 to change its optical properties. Positive ions 111 from the ion storage layer 103 are driven through the ion conductor/electrolyte layer 104 into the electrochromatic layer 105 to change its optical properties. Negative charges 110 are also shown. When voltage 108 has the second value VB, then the portion of the electrochromatic layer 105 overlaid by conductor patterns is altered to be either opaque or reflective.

Figure 2A:
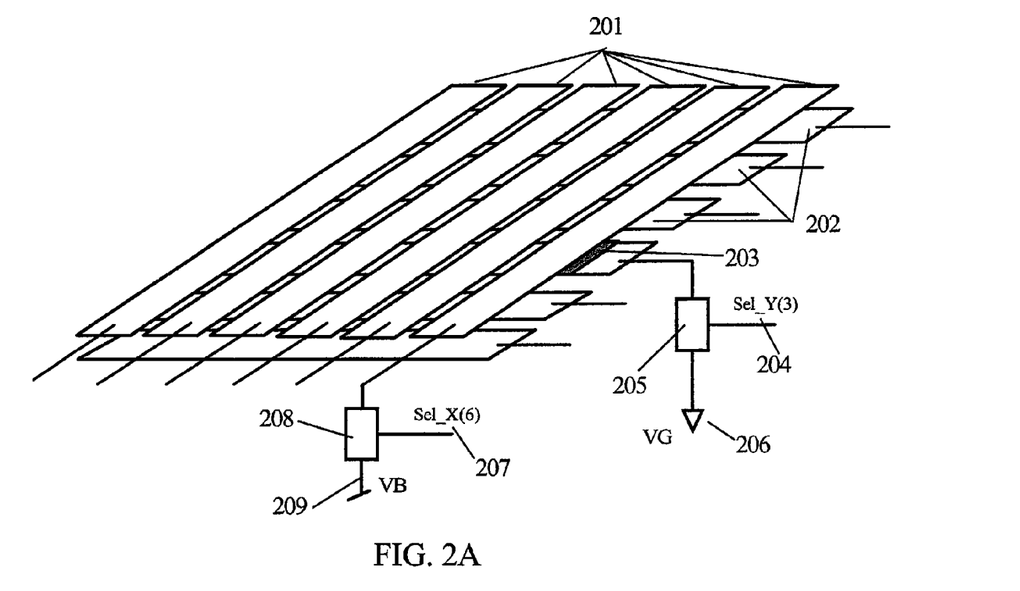
FIG. 2A illustrates a column/row method for addressing pixels of the electrochromatic reticle.

FIG. 2A illustrates portions of an exemplary reticle according to embodiments of the present invention. In this illustration, only the transparent conductor rows 202 and columns 201 are shown. The columns are numbered from left to right and the rows from bottom to top. Exemplary electronic switches 205 and 208 are used to apply the two potentials VB 209 and VG 206 of a voltage source to selected rows and columns. In this example, when Sel_X(6) 207 turns on switch 208 and Sel_Y(3) turns on switch 205, a voltage (VB-VG) is applied across the intersection of row 3 and column 6 causing electrochromatic material 203 to change its optical characteristics. If the electrochromatic material 203 is of the type that retains its altered properties until a reset voltage is applied, then a pattern may be formed by "addressing" selected rows and columns.

Figure 2B:
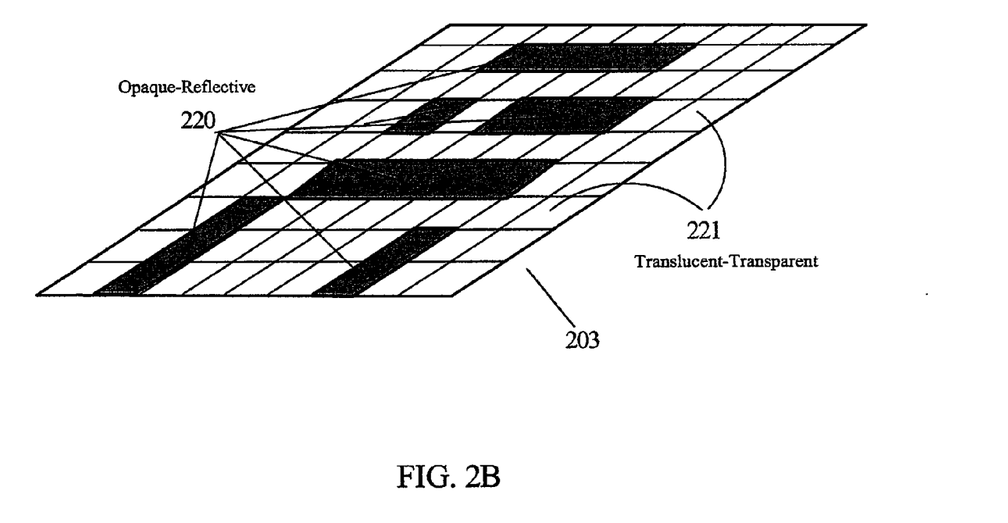
FIG. 2B illustrates opaque and transparent areas of an electrically programmable electrochromatic reticle according to embodiments of the present invention.

FIG. 2B illustrates the electrochromatic material 203 of FIG. 2A where opaque or reflective patterns 220 have been "written" as described in FIG. 2A leaving translucent or transparent areas 221.

Figure 3A:
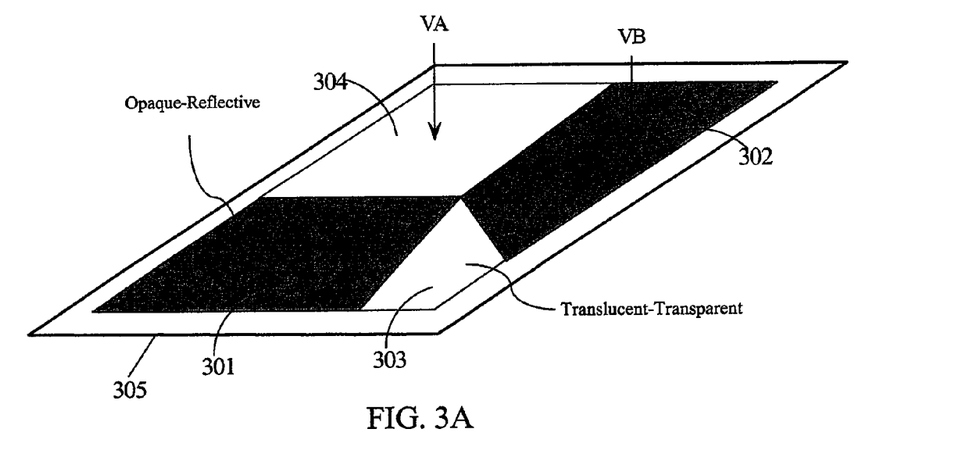
FIG. 3A illustrates an electrically programmable electrochromatic reticle with different voltages applied to different areas.

FIG. 3A illustrates another embodiment of the present invention. An exemplary reticle 305 has patterns that allows a voltage VA to be applied to areas 303 and 304 and a voltage VB to be applied to areas 301 and 302. Voltage VA renders areas 303 and 304 transparent/translucent and voltage VB renders areas 301 and 302 opaque/reflective.

Figure 3B:
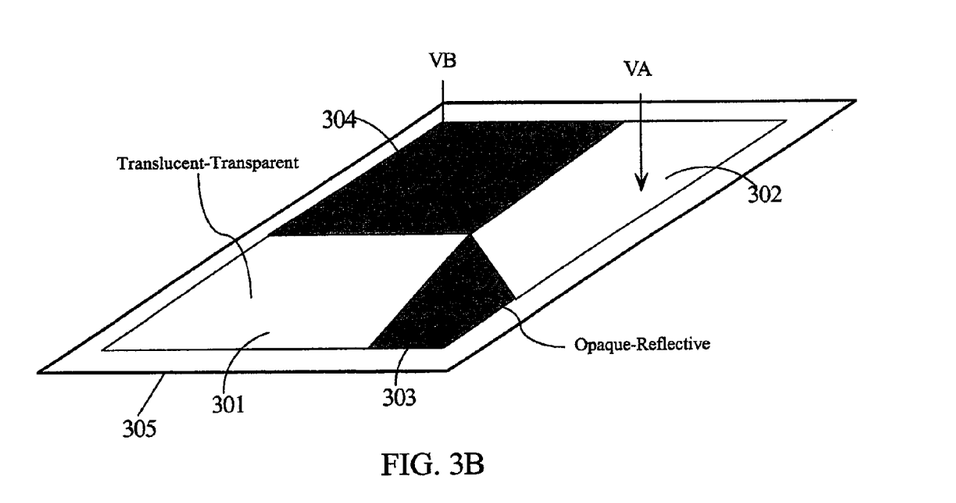
FIG. 3B illustrates the electrically programmable electrochromatic reticle of FIG. 3A with the applied voltages reversed.

FIG. 3B shows the embodiment of FIG. 3A with the voltages potentials to areas 303-304 and 301-302 reversed. Voltage VA to be applied to areas 301-302 and voltage VB to be applied to areas 303-304. Voltage VB renders areas 303 and 304 opaque/reflective and voltage VA renders areas 301 and 302 transparent/translucent.

Figure 4:
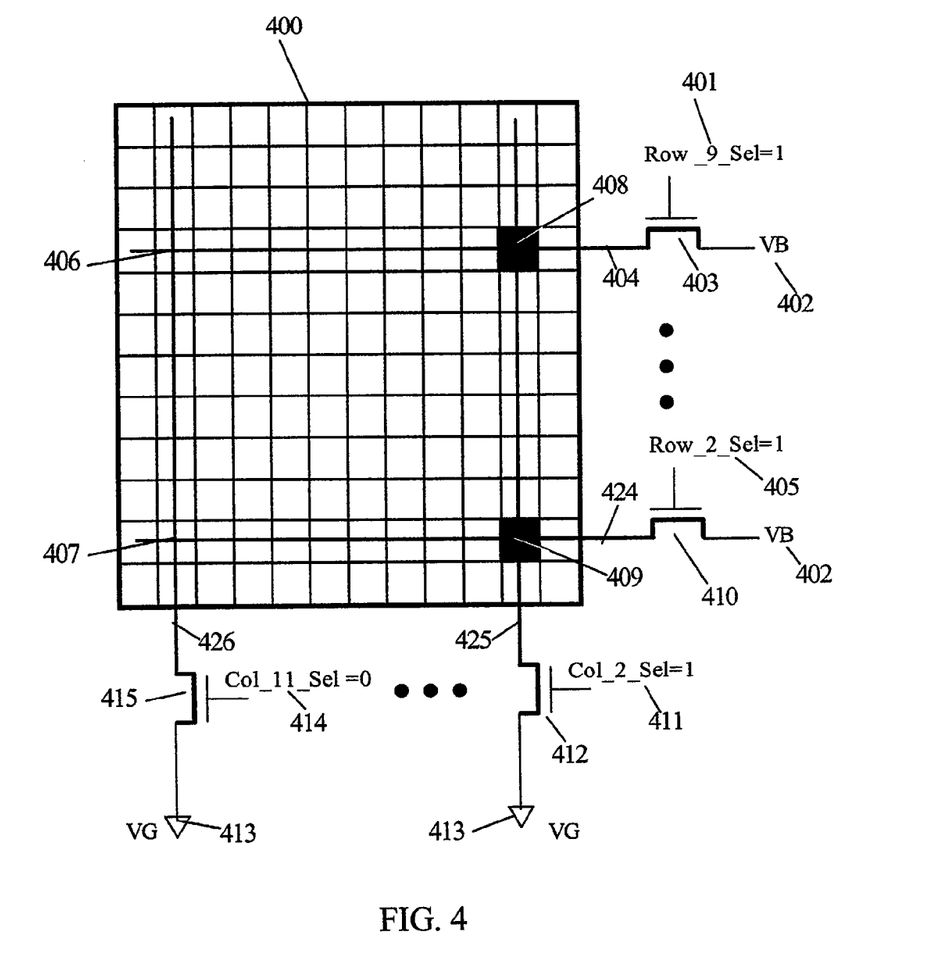
FIG. 4 illustrates two pixels selected with row/column addressing of an electrically programmable electrochromatic reticle according to embodiments of the present invention.

FIG. 4 is another illustration of a matrix implementation of an embodiment of the present invention. Exemplary reticle 400 is "addressed" by applying variable voltage levels to selected rows and columns to "paint" a pattern of opaque or reflective areas. In this example, exemplary Row_2_Sel 405 and Row_9_Sel 401 are set to a logic one, turning on switches 403 and 410 applying voltage VB 402 to conductors 424 and 404 of the second and ninth row, respectively. Likewise, exemplary Col_2_Sel is set to a logic one, turning on switch 412 and applying voltage VG 413 to conductor 425 of the second column. At each intersection 408 and 409, the electrochromatic material is made opaque as illustrated. Since Col_11_Sel is set to a logic zero and switch 415 is off, conductor 426 does not have voltage VG 413 applied and the intersection points 406 and 407 remain in a transparent state.

Figure 5:
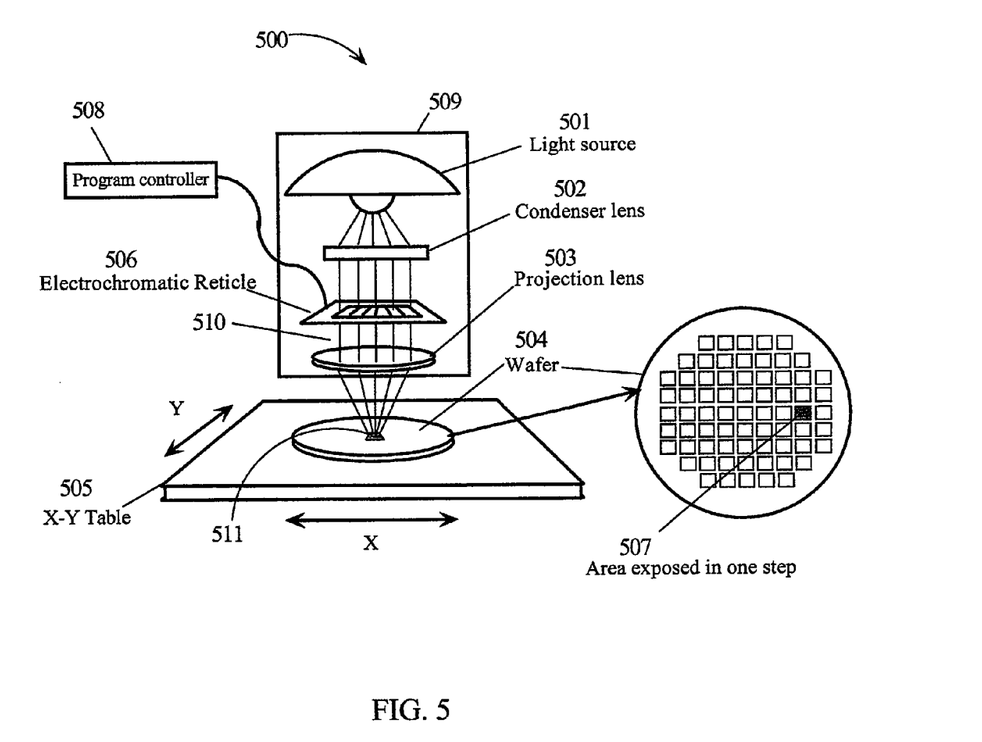
FIG. 5 is a block diagram of a system for exposing patterns on an IC wafer using an electrically programmable electrochromatic reticle according to embodiments of the present invention.

FIG. 5 illustrates a system 500 for exposing patterns on IC wafer 504 according to embodiments of the present invention. An expose unit 509 is positioned a predetermined distance from the IC wafer 504 which is coated with an optically sensitive resist material for a process step. The expose unit 509 has a source of energy (e.g., light source 501 that is collimated using a condenser lens 502). An electrochromatic reticle 506, fabricated and programmed using embodiments of the present invention, contains a pattern to be exposed on wafer 504. Electrochromatic reticle 506 may be programmed in situ to the expose unit 509 with program controller 508 or it may be first programmed off-line and then placed in expose unit 509 for the expose process step. A projection lens 503 is used to reduce the reticle image (predetermined pattern) to a size corresponding to the area 507 that is exposed during each step and repeat operation. X-Y table 505 is used to move the wafer 504 under the expose unit 509.

As such, various embodiments of the present invention comprise an electrically programmable reticle comprising an electrochromatic layer having a substantially reflective area and a substantially opaque area, wherein said substantially reflective area is in response to a first electric field, and further wherein said substantially opaque area is in response to a second electric field.

Various further embodiments comprise a lithography system comprising a light source; and an electrochromatic reticle, wherein said electrochromatic reticle includes a substantially opaque region in response to a first signal and a substantially transparent region in response to a second signal.

Yet further embodiments comprise a method of manufacturing a semiconductor device using a programmable reticle, said method comprising the steps of providing a first voltage to a first portion of an electrochromatic layer of said programmable reticle resulting in said first portion having substantial transparency; providing a second voltage to a second portion of said electrochromatic layer of said programmable reticle resulting in said second portion having substantial opaqueness; directing a beam at a portion of a wafer through said programmable reticle, whereby a semiconductor device is formed.

While a particular embodiment of the invention has been shown and described, numerous variations and alternate embodiments will occur to those skilled in the art. Accordingly, it is intended that the invention be limited only in terms of the appended claims.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes to the claims that come within the meaning and range of equivalency of the claims are to be embraced within their scope. Further, all published documents, patents, and applications mentioned herein are hereby incorporated by reference, as if presented in their entirety.

What is claimed is:

1. A reticle, comprising:
   an electrochromatic layer having a first portion;
   wherein the first portion is configured to transition to a translucent state in response to receiving a first voltage; and
   wherein the first portion is configured to transition to an opaque state in response to receiving a second voltage;
   wherein the electrochromatic layer is formed by a material having a property such that the first portion remains in the translucent state following removal of the first voltage and remains in the opaque state following removal of the second voltage.

2. The reticle of claim 1, further comprising:
   a first conductor layer; and
   a second conductor layer;
   wherein the electrochromatic layer is located between the first and second conductor layers, and wherein the first and second conductor layers are configured to apply the first and second voltages to the first portion.

3. The reticle of claim 2, wherein the first conductor layer includes a plurality of isolated rows, and wherein the second conductor layer includes a plurality of isolated columns, and wherein a first isolated row and a first isolated column are selectable to apply the first and second voltages to the first portion.

4. The reticle of claim 3, further comprising:
   a first switch configured to couple the first isolated row to a first voltage potential in response to receiving a first selection signal; and
   a second switch configured to couple the first isolated column to a second voltage potential in response to receiving a second selection signal;
   wherein the first isolated row and the first isolated column are configured to apply the first voltage to the first portion in response to the first switch receiving the first selection signal and the second switch receiving the second selection signal.

5. The reticle of claim 3, wherein the electrochromatic layer has a plurality of portions including the first portion, and wherein each portion is addressable by selecting a corresponding one of the plurality of isolated rows and a corresponding one of the plurality of isolated columns.

6. The reticle of claim 2, further comprising:
   an ion storage layer; and
   an ion conductor layer;
   wherein the ion storage layer and the ion conductor layer are located between the first conductor layer and the electrochromatic layer, and wherein the reticle is configured to drive ions from the ion storage layer through the ion conductor layer to the electrochromatic layer in response to the second voltage being applied to the first portion.

7. The reticle of claim 2, further comprising:
a first glass layer on which the first conductor layer is deposited; and
a second glass layer on which the second conductor layer is deposited.

8. The reticle of claim 1, wherein the electrochromatic layer includes a nickel-magnesium alloy.

9. The reticle of claim 1, wherein the electrochromatic layer includes tungsten oxide.

10. A method, comprising:
applying a first voltage to an electrochromatic layer of a reticle, wherein applying the first voltage causes a first portion of the electrochromatic layer to transition to a translucent state;
applying a second voltage to the electrochromatic layer, wherein applying the second voltage causes the first portion to transition to an opaque state; and
directing a beam of a light source through the reticle onto a surface, wherein the surface is a wafer, and wherein the method is usable to manufacture a semiconductor device.

11. The method of claim 10, further comprising:
after applying the first voltage, exposing a first area of the wafer to the beam; and
after applying the second voltage, exposing a second area of the wafer to the beam.

12. The method of claim 10, and wherein the method further comprises:
exposing a first area of the wafer to the beam;
moving a table on which the wafer is placed to position a second area of the wafer for exposure; and
exposing the second area of the wafer to the beam.

13. The method of claim 10, further comprising:
selecting one of a plurality of isolated portions of a first conductor layer, wherein the electrochromatic layer is located between the first conductor layer and a second conductor layer;
generating a first voltage differential between the selected isolated portion and a portion of the second conductor layer to apply the first voltage to the electrochromatic layer; and
generating a second voltage differential between the selected isolated portion and the portion of the second conductor layer to apply the second voltage to the electrochromatic layer.

14. The method of claim 13, further comprising:
before generating the first voltage, selecting the portion of the second conductor layer from a plurality of isolated portions of the second conductor layer, wherein the selected isolated portion of the first conductor layer is one of a plurality of isolated rows included in the first conductor layer, and wherein the selected isolated portion of the second conductor layer is one of a plurality of isolated columns included in the second conduct layer.

15. The method of claim 13, wherein generating the first voltage differential includes:
providing a first selection signal to a first switch to cause the first switch to couple the selected isolated portion to a first voltage potential; and
providing a second selection signal to a second switch to cause the second switch to couple the portion of the second conductor layer to a second voltage potential.

16. The method of claim 10, further comprising creating a pattern on the reticle by applying the first voltage to a first set of portions of the electrochromatic layer and by applying the second voltage to a second set of portions of the electrochromatic layer.

17. An apparatus, comprising:
a light source;
a reticle, configured to receive light transmitted by the light source before the light reaches a wafer, wherein the reticle includes an electrochromatic layer having a first portion;
wherein the first portion is configured to transition to a translucent state in response to receiving a first signal; and
wherein the first portion is configured to transition to an opaque state in response to receiving a second signal.

18. The apparatus of claim 17, further comprising:
a controller that is configured to cause a first set of portions of the electrochromatic layer to transition to the translucent state and a second set of portions of the electrochromatic layer to transition to the opaque state.

19. The apparatus of claim 17, further comprising
a table configured to move the wafer from a first position to a second position, wherein the first position permits a first area of the wafer to be exposed to the light, and wherein the second position permits a second area of the wafer to be exposed to the light.

20. The apparatus of claim 17, wherein the electrochromatic layer is located between a first conductor layer and a second conductor layer that are configured to provide the first and second signals to the first portion.

21. The apparatus of claim 20, and wherein the apparatus is configured to:
select one of a plurality of isolated portions of the first conductor layer;
generate a first voltage differential between the selected isolated portion and a portion of the second conductor layer to provide the first signal; and
generate a second voltage differential between the selected isolated portion and the portion of the second conductor layer to provide the second signal.

22. The apparatus of claim 21, further comprising:
a switch configured to couple the selected isolated portion to a first voltage potential to generate the first voltage differential in response to receiving a selection signal, and wherein the apparatus is configured to select the isolated portion by providing the selection signal to the switch.

* * * * *